(12) United States Patent
Fetterman et al.

(10) Patent No.: US 6,404,364 B1
(45) Date of Patent: Jun. 11, 2002

(54) MULTISTAGE CONVERTER EMPLOYING DIGITAL DITHER

(75) Inventors: H. Scott Fetterman, New Tripoli; David Arthur Rich, Whitehall, both of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/645,003

(22) Filed: Aug. 24, 2000

(51) Int. Cl.[7] .............................................. H03M 1/20
(52) U.S. Cl. ...................... 341/131; 341/161; 341/155; 341/141; 341/143
(58) Field of Search ................................ 341/131, 161, 341/155, 143, 141

(56) References Cited

U.S. PATENT DOCUMENTS

| | | | |
|---|---|---|---|
| 4,549,220 A | 10/1985 | Suzuki et al. | 358/283 |
| 4,751,496 A | 6/1988 | Araki et al. | 340/347 |
| 4,764,748 A | * 8/1988 | Geen et al. | 340/347 AD |
| 4,855,745 A | 8/1989 | Smither | 341/156 |
| 4,857,927 A | 8/1989 | Takabayashi | 341/131 |

(List continued on next page.)

OTHER PUBLICATIONS

Patent Abstracts of Japan, Publication No. vol. 014, No. 168 (E–0912), Mar. 30, 1990 and Japan 02 0251156A (Toshiba Corp.), Jan. 26, 1990. Abstract Only.
S. H. Lewis, "A Pipelined 9–Stage Video–Rate Analog–to–Digital Converter" Abstract.
Analog Devices, "12–Bit, 41 MSPS Monolithic A/D Converter".
Paul Allan Conway, "The Application of Random Dither to A Digital Codec," The British Library Document Supply Centre, University of Bradford, 1988.
Yoshio Yamasaki, "The Application of Large Amplitude Dither to the Quantization of Wide Range Audio Signals," Journal of the Japan Audio Society, vol. 39, No. 7 (1983), pp. 452–462.
Risbo, Lars, "On the Design of Tone–Free Sigma Delta Modulators," IEEE Transactions On Circuits and Systems–II: Analog and Digitial Signal Processing, vol. 42, No. 1, Jan. 1995, pp. 52–55.

(List continued on next page.)

Primary Examiner—Michael Tokar
Assistant Examiner—Lam T. Mai
(74) Attorney, Agent, or Firm—David L. Smith

(57) ABSTRACT

A multistage converter and method for converting a sampled analog signal to a corresponding digital representation. Each stage of the converter receives an analog input signal and produces a partial digital output. A first stage receives the sampled analog signal as the analog input signal. Each stage provides a residue output, which is the analog input signal to a subsequent stage. The residue is the analog input signal to the stage, less the analog equivalent of the partial digital output from the stage, possibly with a gain change. A voltage range over which a sample of an analog signal can vary is defined by a lower limit and an upper limit. A lower comparator threshold is established within the voltage range. An upper comparator threshold is established within the voltage range, between the lower comparator threshold and the upper limit. The analog input to the stage is quantized based on the lower and upper comparator thresholds to generate a quantized sampled analog signal. When the quantizes sampled analog signal is between the lower and upper comparator thresholds, dither is added to the quantized sampled analog signal to produce the partial digital output. The partial digital outputs from each stage are provided to an error corrector circuit that removes redundancy and effects of the dither and generates the digital representation corresponding to the sampled analog input. The effect of dither is to improve the spurious free dynamic range (SFDR) of the digital representation of the analog input.

21 Claims, 6 Drawing Sheets

U.S. PATENT DOCUMENTS

| | | | |
|---|---|---|---|
| 5,001,481 A | 3/1991 | Lee | 341/136 |
| 5,073,777 A | 12/1991 | Fukuhara | 341/131 |
| 5,144,308 A | 9/1992 | Norsworthy | 341/131 |
| 5,327,131 A | 7/1994 | Ueno et al. | 341/136 |
| 5,383,033 A | 1/1995 | Takahashi | 358/456 |
| 5,416,481 A | 5/1995 | Chen | 341/131 |
| 5,493,298 A * | 2/1996 | Barta | 341/131 |
| 5,729,571 A | 3/1998 | Park et al. | 375/206 |
| 5,805,305 A | 9/1998 | Abe | 358/457 |
| 5,818,372 A | 10/1998 | Noro | 341/131 |
| 5,889,482 A * | 3/1999 | Zarubliasky | 341/131 |
| 5,963,157 A * | 10/1999 | Smith | 341/131 |
| 6,172,629 B1 * | 1/2001 | Fetterman | 341/131 |

OTHER PUBLICATIONS

Candy, James C., and Gabor C. Temes, "Oversampling Methods For A/D and D/A Conversion," pp. 1–25.

Tesksbury, Stuart K. and Robert W. Hallock, "Oversampled, Linear Predictive and Noise–Shaping Coders of Order N>1," IEEE Transactions On Circuits and Systems, vol. Cas–25, No. 7, Jul. 1978, pp. 139–149.

Norsworthy, Steven R., "Optimal Nonrecursive Noise Shaping Filters For Oversampling Data Converters Part 1: Theory, Part 2: Applications."

Dunn, Chris and Mark Sandler, "A Stimulated Comparison Of Dithered And Chaotic Sigma–Delta Modulators," presented at the $97^{th}$ Convention Nov. 10–13, 1994, AES, pp. 1–37.

Norsworthy, S. R., "Effective Dithering of Sigma–Delta Modulators," Proceedings of the International Symposium on Circuits and Systems, San Diego, May 10–13, 1992, vol. 3 of 6, May 10, 1992, Institute of Electrical and Electronics Engineers, pp. 1304–1307.

Lewis, et al., "A 10–b 20–Msample/s Analog–to–Digital Converter," IEEE Journal of Solid State Circuits, Mar. 1992, vol. 27, pp. 351–358.

David A. Johns and Ken Martin, "Analog Integrated Circuit Design," pp. 513–516, 523–528, published by John Wiley & Sons, Inc. 1997.

* cited by examiner

FIG. 6

| 76 | 78 | 80 | 100 | 104 | 106 | 108 |
|---|---|---|---|---|---|---|
| 0 | 0 | 0 | 0 | 0 | 0 | 1 |
| 0 | 0 | 0 | 1 | 0 | 0 | 1 |
| 0 | 0 | 1 | 0 | X | X | X |
| 0 | 0 | 1 | 1 | X | X | X |
| 0 | 1 | 0 | 0 | X | X | X |
| 0 | 1 | 0 | 1 | X | X | X |
| 0 | 1 | 1 | 0 | X | X | X |
| 0 | 1 | 1 | 1 | X | X | X |
| 1 | 0 | 0 | 0 | 1 | 0 | 0 |
| 1 | 0 | 0 | 1 | 0 | 0 | 1 |
| 1 | 0 | 1 | 0 | X | X | X |
| 1 | 0 | 1 | 1 | X | X | X |
| 1 | 1 | 0 | 0 | 1 | 0 | 0 |
| 1 | 1 | 0 | 1 | 0 | 1 | 0 |
| 1 | 1 | 1 | 0 | 0 | 1 | 0 |
| 1 | 1 | 1 | 1 | 0 | 1 | 0 |

MULTISTAGE CONVERTER EMPLOYING DIGITAL DITHER

FIELD OF THE INVENTION

Analog-to-digital converters (ADCs) convert an analog input that is a sample of an analog signal into a corresponding digital representation. This invention relates to multistage converters and in particular to multistage analog-to-digital converters employing dither to reduce non-linearity.

BACKGROUND OF THE INVENTION

Analog-to-digital converters (ADCs) convert an analog input that is a sample of an analog signal into a corresponding digital representation. Multiple stage ADCs include a plurality of stages, each of which converts a portion of the analog input, and each of which contributes to the digital representation. Multistage converters receive the analog input in a first stage for processing. The first stage determines one or more bits. A residue representing the portion of the analog input not converted by that or previous stages is generated and passed to a subsequent stage for processing to determine one or more additional bits. This process continues through each of the stages of the converter. When each stage completes processing the analog input or residue, each stage is ready to receive a new analog input or residue to process. One type of multiple stage converter is known as a pipelined converter. Due to the time required to fill the pipeline, pipelining causes an initial latency in computing the digital representation corresponding to an analog input sample. However, pipelining increases the rate at which digital representations corresponding to sequential analog input samples are generated by the converter due to parallel processing of the samples.

Each stage of a multistage ADC may produce more bits than the output of that stage represents in a digital representation of a sample of the analog input to the first stage of the converter, providing some redundancy of information for error correction. Error correction may be employed to ease the circuit design requirements for the internal circuitry of the converter. An error corrector circuit receives the bit or bits produced by each stage of the multistage converter, skewed in time, and generates a corresponding digital output, digital representation, or digital word that is representative of the sample of the analog input. The error corrector circuit output can also be the digital output from the multistage converter.

Multistage converters are disclosed in various publications, including "A 10-b 20-Msample/s Analog-to-Digital Converter", by Lewis, et al, IEEE Journal of Solid State Circuits, Mar. 1992, Vol. 27, pp. 351–358, Analog Integrated Circuits Design, by D. A. Johns and K. Martin, as well as U.S. patent application Ser. No. 09/025,956, the disclosures of which are hereby incorporated by reference.

One known technique to reduce non-linearity in an analog-to-digital converters is to add random noise to the input signal. Adding random noise to the input signal reduces the signal-to-noise ratio of the converter. To reduce non-linearity without reducing the signal-to-noise ratio, random noise energy may be added to the signal in a portion of the available frequency spectrum that is not of interest. However, for this technique to be useful in a particular application, there must be a portion of the available frequency spectrum that is not of interest where the noise can be added. In applications requiring the full range of available bandwidth for a signal, this technique can not be used. Furthermore, this technique reduces the dynamic range of a converter in which it is employed.

Various non-idealities which may be present in an ADC result in non-linearities in the ADC transfer function and a corresponding reduction in performance. To meet the accuracy requirements as defined by the bits of ADC resolution, the non-linearities must not exceed one least significant bit (LSB) in magnitude. Although the non-linearities in a pipelined ADC may be less than one LSB, they may have a repetitive or periodic nature, which results in the generation of spurious tones in the frequency spectra of the digital representation of the analog input. An important measure of an ADC's performance is spurious free dynamic range (SFDR), which is defined in the frequency domain as the amplitude difference between a spectrally pure input signal and the highest non-input signal component present in the frequency spectra of the ADC's digital output representation of the analog input signal. Some of the non-idealities that affect the SFDR performance of pipelined converters are, finite opamp gain, capacitor matching, and reference voltage variations.

What is needed is a technique to improve the ADC SFDR. Given the presence these non-idealities, one way to alter the SFDR performance of a pipelined converter is to change the placement of comparator thresholds. In a pipelined converter, randomly varying the comparator thresholds within a correctable range, a form of dithering, improves the ADC SFDR by spreading the energy that previously had been present in spurious tones over a wider frequency range but with a lower amplitude. Such a technique would retain the desirable aspects of introducing dither without consuming a portion of the available frequency spectrum or reducing the dynamic range of the converter, thereby leaving the entire available frequency spectrum for signal bandwidth.

SUMMARY OF THE INVENTION

In accordance with the invention, a multistage converter and method for converting a sampled analog signal to a corresponding digital representation. Each stage of the converter receives an analog input signal and produces a partial digital output. A voltage range, having a lower limit and an upper limit, is defined over which samples of the input analog signal can vary. A first stage receives the sampled analog signal as the analog input signal. Each stage except a last stage provides a residue output, which is the analog input signal to a subsequent stage. The residue is the analog input signal to the stage less the partial digital output from the stage, possibly with a gain change.

A lower comparator threshold is established between the lower limit and upper limit of the voltage range. An upper comparator threshold is established within the voltage range, the upper comparator threshold being between the lower comparator threshold and the upper limit. The internal error correction circuitry allows each of these two thresholds to vary over a predetermined range without causing errors greater than one LSB in the transfer function of the ADC. Thresholds are intentionally placed at the extreme ends of two correctable comparator ranges defining a correctable error range. A third threshold is established in the center of the correctable error range where the two correctable comparator ranges meet, at the bottom end of the upper comparator correctable range and the top end of the lower comparator correctable range. This third threshold defines the middle comparator threshold.

The analog input to the stage is quantized based on the lower comparator threshold, middle comparator threshold, and upper comparator threshold to generate a digital word which is representative of the region within the conversion voltage range in which the analog input resides. When the quantized analog input signal falls between the upper comparator threshold and middle comparator threshold, the digital word representative of the region in which the analog input resides may at the end of each quantization cycle be randomly changed (dithered), without causing errors greater than one LSB in the transfer function of the ADC, to reflect that the analog input had been between the upper end of the conversion range and the upper comparator threshold. Similarly, when the quantized analog input signal falls between the middle comparator threshold and lower comparator threshold, the digital word representative of the region in which the analog input resides may at the end of each quantization cycle be randomly changed (dithered), without causing errors greater than one LSB in the transfer function of the ADC, to reflect that the analog input was between the lower comparator threshold and the lower end of the voltage range. The effect of this dither is to randomly create threshold errors that are correctable by the ADC architecture.

The partial digital outputs from each stage are provided to an error corrector circuit that removes redundancy and effects of the dither when generating the digital representation corresponding to the sampled analog input.

BRIEF DESCRIPTION OF THE DRAWING

FIG. 6 is a truth table of outputs, based on all possible combinations of inputs, for the circuit of FIG. 5;

DETAILED DESCRIPTION

Figure 1:
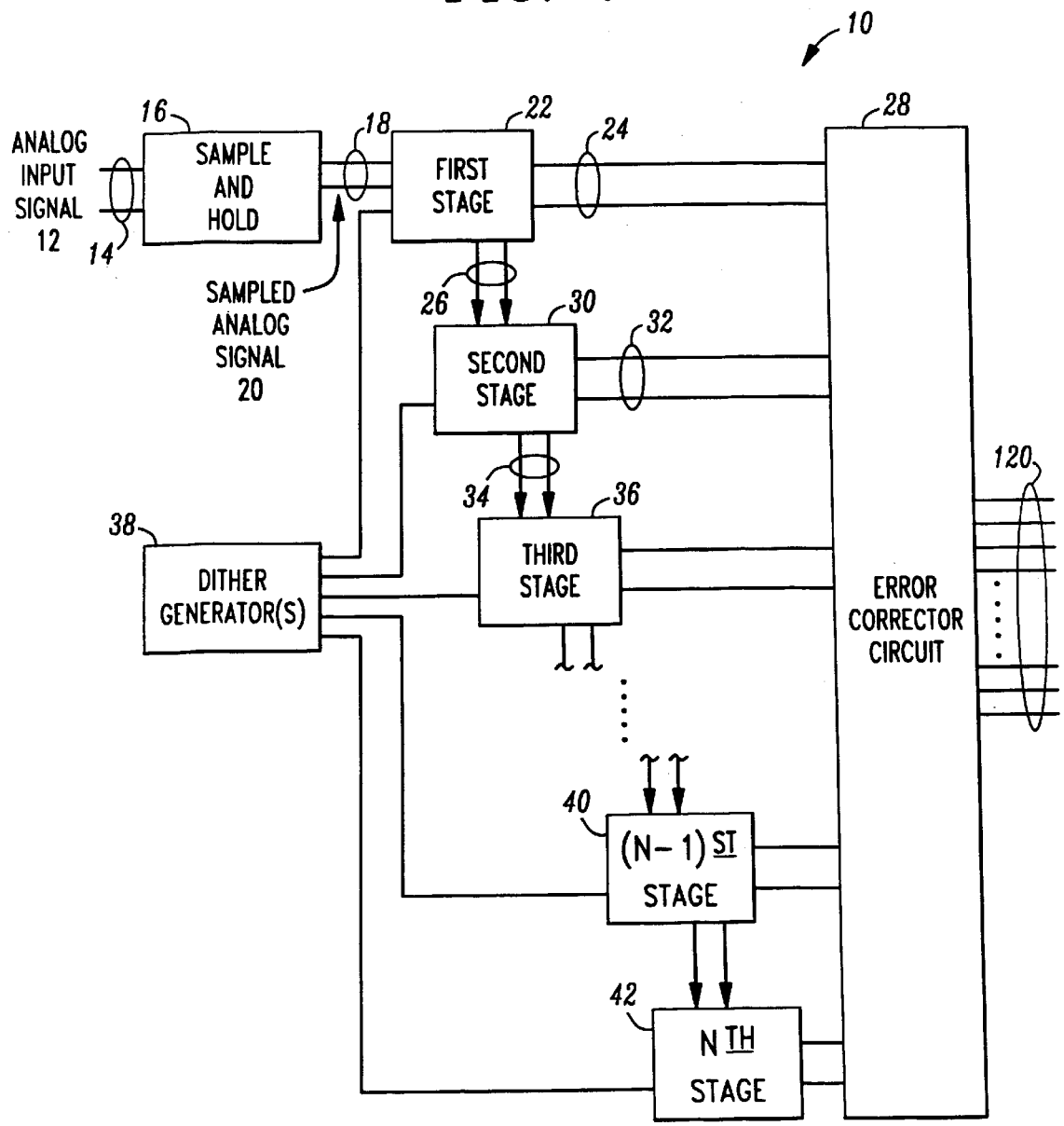
FIG. 1 is a simplified schematic diagram of a portion of a multistage analog-to-digital converter in accordance with the present invention.

A simplified schematic diagram of multistage ADC 10 in accordance with an illustrative embodiment of the invention is shown in FIG. 1. For purposes of illustration, an (N+1)-bit converter 10, with each stage generating two bits of output, will be discussed. Although a fully differential converter is illustrated, it is understood that one skilled in the art could implement the converter as a single ended circuit. In the illustrated embodiment, each stage, sometimes referred to as a pipe, produces two bits of output. To achieve an (N+1)-bit output from the converter, N stages are provided. However, the invention is not limited thereto. One skilled in the art could implement a converter that produces a different number of output bits, a converter having a different number of stages, or a converter having stages that produce a different number of bits than the illustrated embodiment. The converter may be a stand-alone converter or may be a portion of an integrated circuit such as a microprocessor, microcontroller, digital signal processor, codec, radio, or other mixed signal integrated circuit.

A scaled analog input signal 12 is applied to the input 14 of sample-and-hold circuit 16. Sample and hold circuit 16 provides as an output 18 a sampled analog signal 20. First stage 22 receives the sampled analog signal 20 as an input and generates a first stage digital output 24 of one or more bits representative of the sampled analog signal 20. In the illustrated embodiment, the first stage digital output 24 is two bits. The sampled analog signal 20 is represented by the first stage digital output 24 and the first stage residue 26 as is known in the art. The first stage residue 26 is provided as an input to the second stage. The first stage digital output 24 is provided as an input to error corrector circuit 28.

Second stage 30 receives as an input the first stage residue 26. Second stage 30 generates a second stage digital output 32 representative of the first stage residue 26. In the illustrated embodiment, the second stage digital output 32 is two bits. The second stage digital output 32 is provided as an input to error corrector circuit 28. The first stage residue 26 may be level shifted and increased by a gain factor, resulting in a second stage residue 34. The second stage residue 34 is provided as an input to third stage 36.

Dither from dither generator 38 is provided to at least one stage of multistage converter 10. Dither may be applied to selected ones of the stages or dither may be applied to all of the stages of multistage converter 10. Preferably independent dither signals are provided to each stage of multistage converter 10 to which dither is applied. Although represented in FIG. 1 by a single line, there may be multiple dither signals provided to each stage by dither generator 38.

Error corrector circuit 28 is a logic circuit that receives as inputs the digital outputs generated by each stage of multistage converter 10. The digital outputs from each stage represent signal samples, which when combined and redundancy is eliminated, are the corresponding digital representation of a sample of the analog input. The digital outputs from the stages of converter 10 are skewed in time due to the structure of the converter which serially processes stage residues. The digital outputs from the stages of converter 10 may be stored upon receipt by error corrector circuit 28 until the digital outputs from all stages contributing to the digital representation of a single analog input sample are received for further processing by error corrector circuit 28. As is known in the art, error corrector circuit 28 receives the outputs (such as 24 and 32) from each stage, corrects errors based on the redundant information contained in the digital outputs, eliminates the redundancy, and provides a multi-bit output, digital output 120, of a predetermined number of bits. Digital output 120 is both a digital representation corresponding to a sample of an analog input to multistage converter 10, and an output of multistage converter 10. Error corrector circuit 28 corrects for the intentional dither related changes in the partial digital output from each stage, since, depending on the input to a stage, dither is not allowed to change to that stage's digital outputs on any conversion cycle which would result in an error that could not be corrected.

Figure 2:
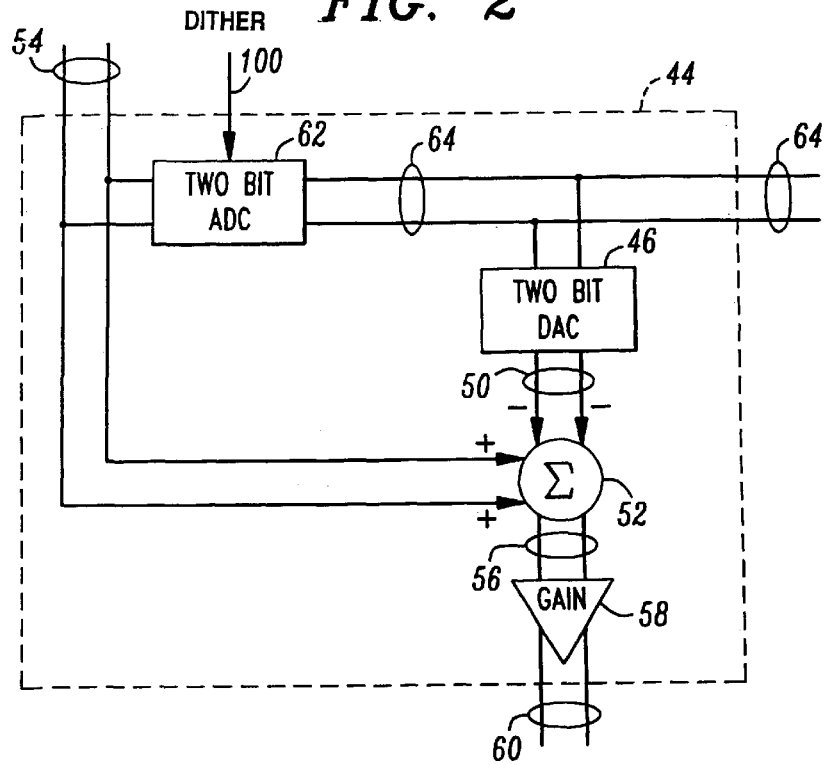
FIG. 2 is a simplified schematic diagram of a typical stage of the multistage analog-to-digital converter of FIG. 1.

FIG. 2 is a simplified block diagram of a typical stage 44 of multistage converter 10, such as first stage 22, second stage 30, third stage 36, (N−1st stage 40, or Nth stage 42. Analog input signal 54 is provided as an input to analog-to-digital subconverter 62. Subconverter 62 converts the analog input signal to a digital signal, such as a digital output 64. Digital output 64 is provided to both an error corrector circuit 28 and two-bit digital-to-analog converter 46. Digital-to-analog converter 46 is a digital-to-analog converter that receives the digital output 64 from subconverter 62 and converts the digital representation to a corresponding analog signal 50. Analog signal 50 is presented as an input to summing node 52. Analog input signal 54 is provided as another input to summing node 52. Summing node 52 subtracts analog signal 50 from analog input signal 54, thereby removing from analog input signal 54 the portion of the signal represented by digital output 64, to provide an analog difference signal 56, an internal stage residue.

Analog difference signal 56 represents the portion of analog input signal 54 not converted by subconverter 62. Analog difference signal 56 is provided as an input to amplifier 58, if present, which provides a very accurate gain. In a preferred embodiment, the gain of amplifier 58 is a gain of two. Analog difference signal 56 is gained-up to maintain the residue within the linear range of analog circuitry in the subsequent stage, which also permits the stages to be substantially identical. Amplifier 58 provides as an output an amplified difference signal 60 as an analog output that is an amplified (gained-up) version of the internal stage residue of stage 44. Variations in the gain of the stages other than being as designed, results in discontinuities in the output-to-input relationship of the stage which results in the digital output from a stage not accurately reflecting the analog input. The digital output of a stage not accurately reflecting the analog input results at a stage level in an erroneous digital output for a given analog input, which can appear as spurious tones in the frequency domain. Increasing the difference signal by a gain factor in amplifier 58 of each stage, coupled with subtracting from the analog input the portion of the analog range represented by the digital output 64, as is known in the art, maintains the signal-to-noise ratio and the amplified difference signal 60 within the dynamic range of analog circuitry in subsequent stages of multistage converter 10. Amplified difference signal 60 is a residue of stage 44 that is provided to a subsequent stage, if present, for further processing.

The analog input signal 54 to the first stage 22 is the sampled analog signal 20. The analog input signal 54 provided to subsequent stages is the residue, amplified difference signal 60, from a previous processing stage. The Nth stage of multistage converter 10 need not provide an internal stage residue or a residue as there is no subsequent stage.

With dither 100 introduced to vary the partial digital output of a stage depending upon the analog input to that stage, the digital output 64 from that stage provided to error corrector circuit 28 will differ for some analog input ranges from when dither is not present. Dither signal 100 forces some stages, depending upon that stage's analog input level, to make a correctable error, randomly. When dither or other analog-to-digital subconverter effects such as inadequate settling time, offset, or charge injection, cause subconverter 62 to make a decision that is different than when dither is not present, difference signal 56 will be different, in an absolute magnitude sense, than it would be absent the dither. Even though a particular stage may produce an different digital output due to the dither, the next stage will compensate for the error. Amplifier 58 must be able to accommodate a potentially larger difference signal, and the next subsequent stage, if present, must be able to accommodate receiving a larger analog input signal. One technique to accommodate the potential of a larger residue is to use a subconverter that produces more bits than necessary. For example, in the illustrated embodiment, a two-bit subconverter 62 is employed when a single bit subconverter would otherwise suffice. The additional bit(s) provide(s) redundant information that is used by error corrector circuit 28.

Subconverter 62 converts an input signal from analog form to an output signal in digital form, along with an analog residue. The digital output from subconverter 62 represents a portion of the analog input signal, and the residue represents the remaining portion of the analog input signal.

Figure 3:
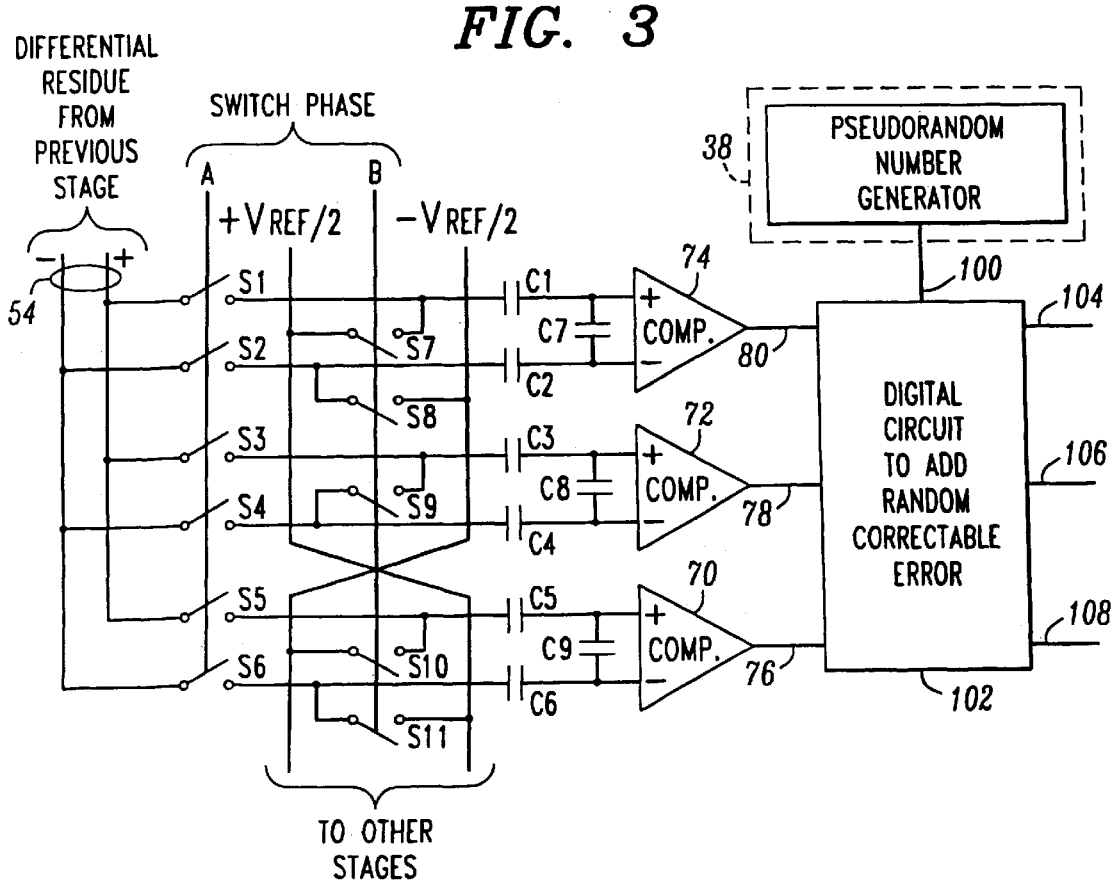
FIG. 3 is a simplified schematic diagram of an analog-to-digital subconverter useful in the multistage analog-to-digital converter of FIG. 1.

Subconverter 62 may be implemented as a slicing circuit using comparators to slice an analog input signal into a predetermined number of levels. Each of the stages of multistage converter 10 produces at least one bit of the digital representation of the sample of the analog input, with the last stage contributing at least two bits of the digital representation. The analog range of each stage is divided into at least three non-overlapping regions. A switched capacitor implementation of a subconverter 62 is shown in FIG. 3 in which three comparators 70, 72 and 74, a dither generator 38, and circuit 102 randomly alter the comparator output signals 76, 78 and 80 to generate dither output signals 104, 106, and 108 depending on the analog input 54 (adding dither). Two of the digital outputs 104, 106, or 108 are provided as digital output 64 to error correction circuit 120. Preferably, the same two dithered signals from each stage of multiple stage converter 10 are provided to error correction circuit 120, although the invention is not limited thereto. The slice points at which signals may be sliced are determined by setting the comparator thresholds. Slice points demark one level from an adjacent level or levels.

When the threshold of comparators remain fixed, the location of discontinuities in the transfer function of multistage converter 10 remain fixed. The resulting output, when viewed in the frequency domain, will contain new spectral components that are harmonically related to the frequencies present in the signal input to the multistage converter. If the threshold dynamically varies within a range correctable by error corrector circuit 28, the resultant undesirable spectral components in the frequency domain would also vary. Concomitantly, to vary the threshold in a statistically random manner would cause the undesirable spurious tones to also vary randomly. Thus energy present in the spurious tones would spread out over many frequencies at correspondingly lower amplitudes. The intentional random variation of a parameter is sometimes referred to as dither.

Slicing the signal into more levels may require more comparators and may require a different, higher, number of bits to represent as a binary number which of the levels the sliced signal falls into. Generally, with M comparators in each stage, with a threshold introducing discontinuity into the transfer function of the stage of multistage converter 10, results in M+1 regions in the transfer function. Less than all of the combinations of bits may be used.

The two bit digital output 64 represents one of the three levels into which the signal is sliced. The digital output 64 is used by the error corrector circuit 28 to determine the digital output 120, and for level shifting (subtracting from the analog input to a stage the analog signal_equivalent represented by the digital output of that stage) the internal stage residue. Each comparator receives as a first input the amplified difference signal 60 from a previous stage, or in the case of first stage 22, the sampled analog signal 20, and as a second input one or more threshold settings for comparators 70, 72 and 74.

In the switched capacitor implementation illustrated in FIG. 3, clock phases A and B are generated as two phases of a non-overlapping clock signal. Switched phases A and B operate the switches S1, S2, S3, S4, S5, S6, S7, S8, S9, S10 and S11, as is known in the art. With clock phase B high, switches S1, S2, S3, S4, S5 and S6 are opened isolating the differential inputs of comparators 70, 72 and 74 from the residue from the previous stage. Switches S7, S8, S9, S10 and S11 are closed to establish reference conditions on capacitors C1, C2, C3, C4, C5 and C6. Additional switches (not shown) couple the differential inputs of comparators 70, 72 and 74 to a reference(not shown), such as a reference voltage. The reference charges capacitors C1, C2, C3, C4, C5 and C6 to maintain the comparators in a linear operating region. When clock phase B transitions low, the reference, which could be the slicing threshold voltage, is stored on capacitors C1, C2, C3, C4, C5 and C6 at the comparator inputs.

When clock phase A transitions high, the input to a stage is coupled to the differential inputs of the comparators and to the residue which is passed on through the same capacitors C1, C2, C3, C4, C5 and C6 that were charged while clock phase B was high. At the end of phase A, the output of comparators 70, 72 and 74 are latched as comparator output signals 76, 78 and 80, respectively, and provided to circuit 102. The dither and decoder circuit 102 processes the comparator output signals 76, 78 and 80 into dithered output signals 108, 106, and 104 for the next pipeline stage. Only one of the signals 104, 106, or 108 will be activated for each comparison cycle, with the choice dependent upon the previous stage residue 54 and the dither word 100.

Figure 4:
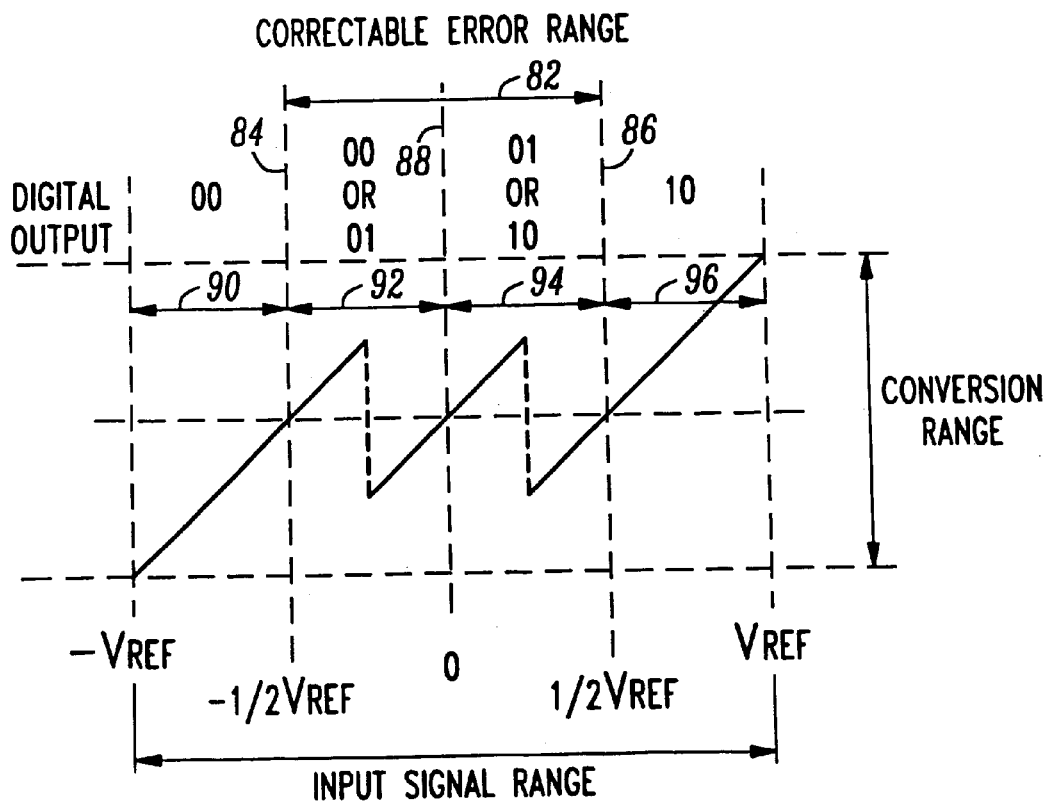
FIG. 4 is a diagram illustrating a possible placement of comparator thresholds, conversion range and correctable error range for the converter of the present invention.

FIG. 4 is a graphical representation of the analog residue and comparator outputs versus the analog input, or transfer function, for each stage of multistage converter 10. Two correctable error ranges 92, and 94 exist in which the comparator thresholds must fall in order for the converter to retain the next stage residue within the linear conversion range of the analog circuitry. The correctable error range 92 is defined by the lower endpoint 84, and an upper endpoint 88. The correctable error range 94 is defined by the lower endpoint 88 and the upper endpoint 86. As long as the lower comparator threshold falls within correctable error range 92, and the upper comparator threshold falls within correctable error range 94, the next stage is capable of accepting and correctly converting the residue without exceeding the linear range of its analog circuitry. The threshold of comparators 70, 72 and 74 define endpoints 84,88, and 86. Analog input signal 54 to a subconverter 62 or stage of multistage converter 10 is provided simultaneously to each of comparators 70, 72 and 74 of the stage.

As illustrated in FIG. 4, the threshold of comparator 70 is set at the lower endpoint 84 of the correctable error range 92, and also the lower endpoint 84 of correctable error range 82. In the illustrated embodiment lower endpoint 84 is minus one-half of the reference voltage, Vref. Thus, when analog input signal 54 is provided to comparator 70, comparator output signal 76 is low when the magnitude of analog input signal 54 is less than negative one-half Vref, and is high otherwise.

The threshold of comparator 72 is set at upper endpoint 88 of correctable error range 92 and corresponding lower endpoint for the correctable error range 94. In the illustrated embodiment endpoint 88 is at zero volts. Thus, when analog input signal 54 is provided to comparator 72, comparator output signal 78 is low when the magnitude of the analog input signal is below midpoint 88, and is high otherwise.

The threshold of comparator 74 is set at upper endpoint 86 of correctable range 94 and also the upper endpoint 86 of correctable error range 82. In the illustrated embodiment upper endpoint 84 is at positive one-half of the reference voltage, Vref. Thus, when analog input signal 54 is provided to comparator 74, comparator output signal 80 is low when the magnitude of the analog input signal is less than positive one-half of the reference voltage Vref, and is high otherwise.

Comparators 70, 72, and 74 define regions 90, 92, 94, and 96 in the transfer function conversion range of the stage, as illustrated in FIG. 4. Region 90 extends from the lower limit of the conversion range, minus Vref, to the threshold (or slicing level) of comparator 70. Region 92 extends from the threshold (or slicing level) of comparator 70 to the upper endpoint of the correctable error range 92, which is the threshold (or slicing level) of comparator 72. Region 94 extends from the lower endpoint of the correctable error range 94 to the threshold (or slicing level) of comparator 74. Region 96 extends from the threshold (or slicing level) of comparator 74 to the upper conversion range limit, plus Vref.

In a preferred embodiment, regions 90, 92, 94, and 96 are of equal magnitude portions of the range of the analog input signal. Ideally, the threshold of comparator 70 defines the lower limit of the correctable error range 92, and the threshold of comparator 74 defines the upper limit of the correctable error range 94, however, the invention is not limited thereto. The threshold of lower comparator 70 can move to be more positive and the threshold of upper comparator 74 can move to be more negative and the converter will be able to correct errors due to the introduction of dither.

Figure 5:
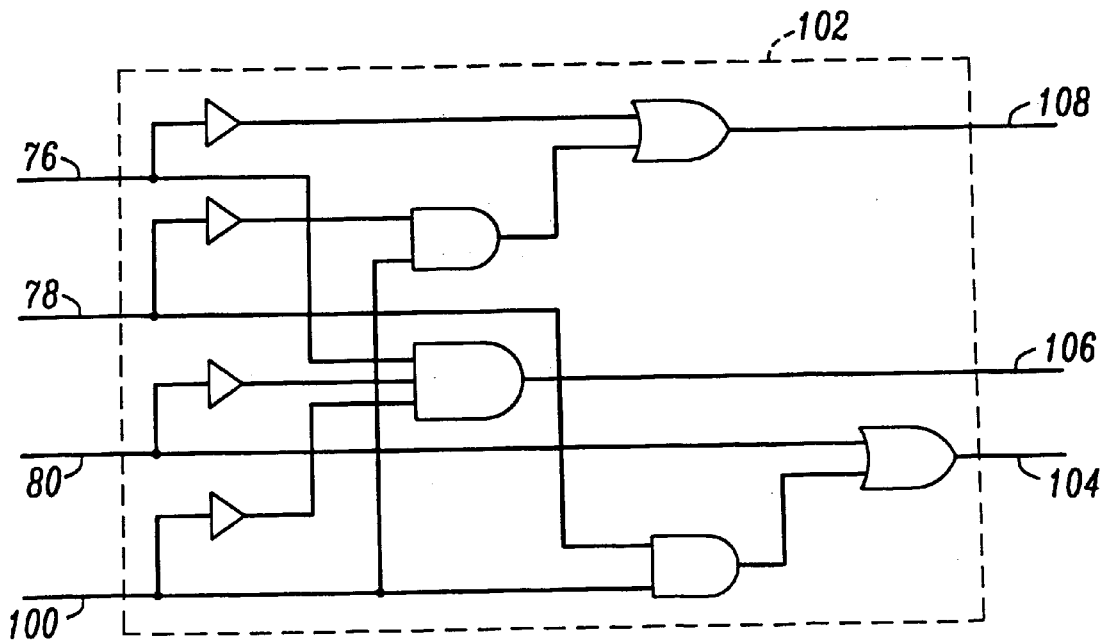
FIG. 5 is a simplified schematic diagram of a portion of an analog-to-digital converter illustrating a circuit for introducing dither.

After a decision regarding slicing the analog input signal has been made in a stage by comparators 70, 72, and 74, comparator output signals 76, 78, and 80 are provided to circuit 102. As can be seen in FIG. 3, the comparator output signals 76, 78, and 80, as well as a dither signal 100 from dither generator 38, are provided as inputs to circuit 102. Circuit 102 applies dither to the comparator output signals 76, 78, and 80 on a once per conversion cycle basis, and only when the errors it would create are correctable by the subsequent error corrector circuit 28. A circuit to achieve the combination of dither with the comparator output signals 76, 78, and 80 is illustrated in FIG. 5.

A truth table for the operation of circuit 102 is shown in FIG. 6. Some of the possible combinations of comparator output signals 76, 78 and 80 will not occur. These combinations are indicated in the truth table of FIG. 6 with an "X", indicating a "don't care" state, in the columns of dithered output signals 104, 106 and 108.

Circuit 102 receives the comparator output signals 76, 78 and 80, and dither signal 100 from dither generator 38, and combines these inputs to generate dithered outputs 104, 106 and 108. Preferably, dither signal 100 is an independent, random signal for each stage of multistage comparator 10. When the comparator output signal 76 is a logic low and therefore within range 90, the other comparator output signals 78 and 80 are also logic low signals. Output signal 108 is maintained as a high while output signals 106 and 104 are held at a logic low, all without regard of the logic state of dither signal 100.

When the comparator output signal 80 is a logic high and therefore within range 96, the other comparator output signals 76 and 78 are also logic high signals. Output signal 104 is maintained as a logic high while output signals 106 and 108 are held at a logic low, all without regard of the logic state of dither signal 100.

When comparator output signal 76 is a logic high and comparator output signal 78 is a logic low, comparator output signal 80 will also be a logic low. With the comparator outputs 76, 78 and 80 in this pattern, the analog input signal 54 to the stage is located within correctable error range 92 and may be reported as being either in range 90 or 92 depending on the dither input word. Thus, when dither 100 is a logic low, output signals 108, 106 and 104 are outputted as logic low, logic high and logic low, respectively. Alternately, when dither 100 is a logic high, dither output signals 108, 106 and 104 are outputted as logic high, logic low and logic low, respectively.

When comparator output signal 80 is a logic high both comparator output signals 76 and 78 will also be a logic high. With the comparator outputs in this pattern, the analog input signal 54 to the stage is located within correctable error range 94 and may be reported as being either in range 94 or 96 depending on the dither input word. Thus, when dither 100 is a logic low, output signals 108, 106 and 104 are outputted as logic low, logic high and logic low, respectively. Alternately, when dither 100 is a logic high, dither output signals 108, 106 and 104 are outputted as logic low, logic low and logic high, respectively.

Since three logic level dithered output signals are generated, only two bits are required to be provided to error correction circuit 120 to retain all of the information of the three signals. Three bits can represent all of the possible combinations of states of the of the three logic level dithered output signals 104, 106, and 108.

Dithered outputs from circuit 102 are provided to digital error corrector circuit 28 and two-bit DAC 46. The cycle repeats with clock phase A transitioning low and clock phase B transitioning high.

Figure 7:
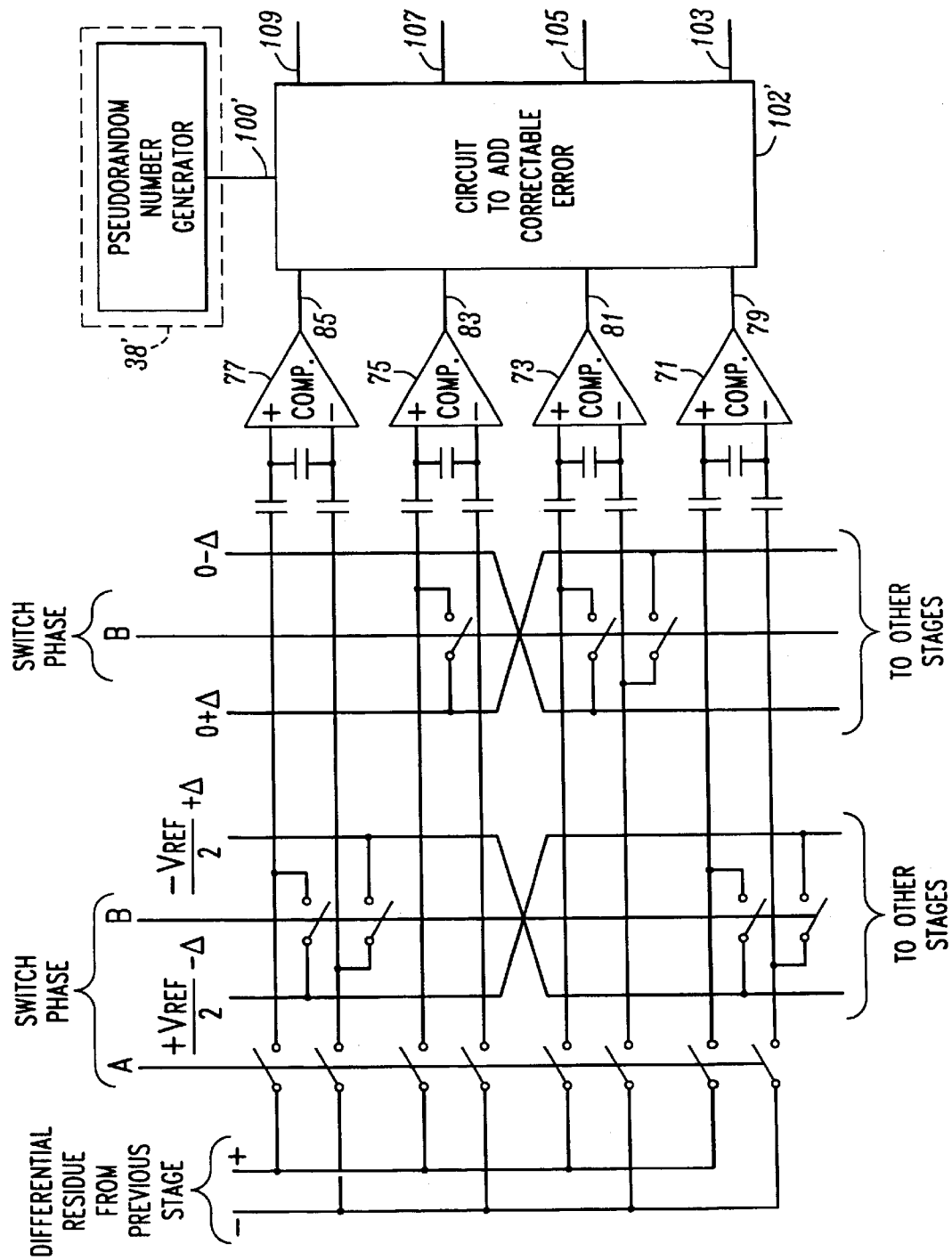
FIG. 7 is a simplified schematic diagram of an alternate embodiment analog-to-digital subconverter useful in the multistage analog-to-digital converter of FIG. 1.
Figure 8:
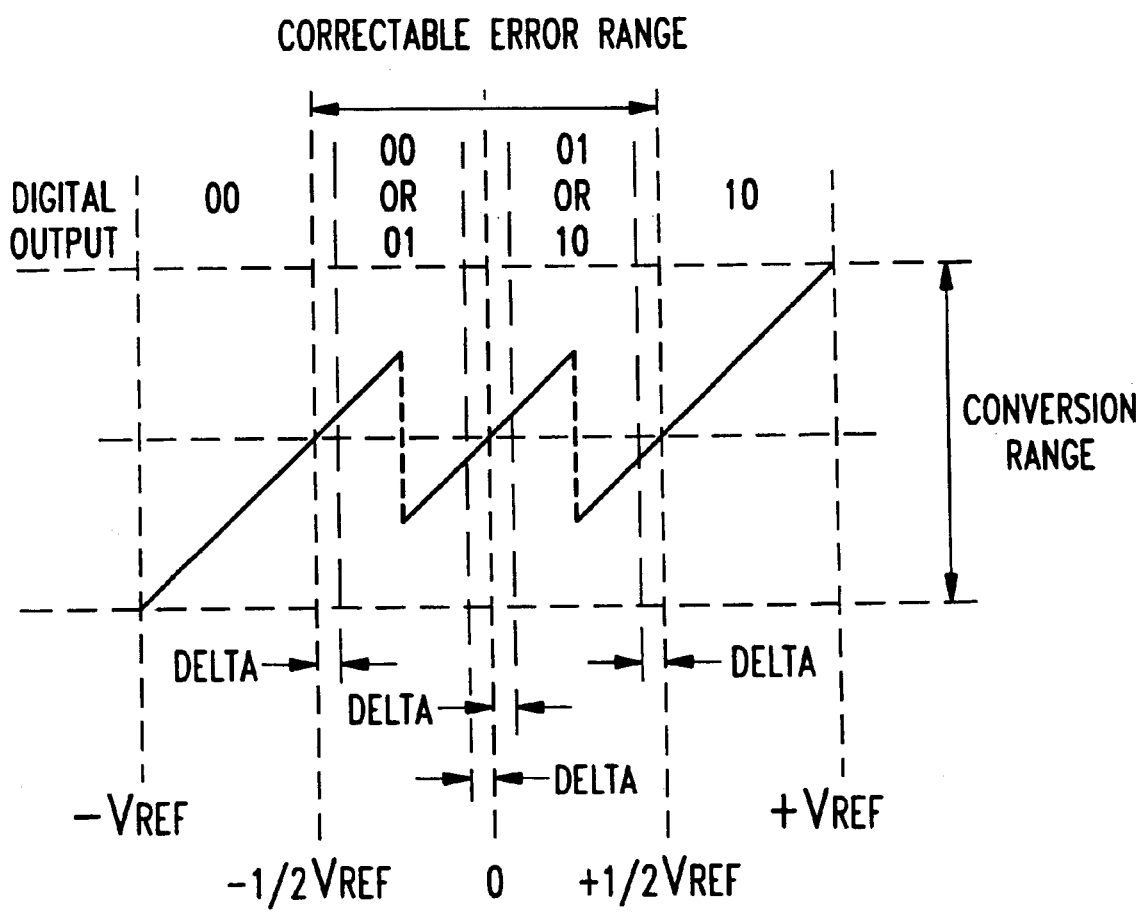
FIG. 8 is a diagram illustrating an alternate embodiment placement of comparator thresholds, conversion range and correctable error range.

FIG. 7 illustrates a stage of an alternate embodiment multiple stage converter 10' in which four comparators are employed to slice an incoming analog signal into five levels. The embodiment of FIG. 7 allows for a slight error margin in the threshold placement of the comparators. FIG. 8 is a diagram illustrating an alternate embodiment placement of comparator thresholds, conversion range and correctable error range. In view of the above explanation of the invention, one skilled in the art could set the thresholds of comparators 71, 73, 75, and 77, as well as develop the digital logic for digital circuit to add correctable error 102'.

The effect of dither is to decrease the magnitude of spurious tones in digital output 120 by spreading the spurious tonal energy over a wider frequency range than the spurious tones would occupy absent the dither. Using the technique disclosed herein, the dither is introduced without utilizing a portion of the frequency spectrum as in other dithering techniques. Introducing dither without utilizing a portion of the frequency spectrum leaves the full frequency spectrum available for signal bandwidth. Furthermore, this technique of introducing dither does not use any of the signal dynamic range as in other dither techniques. The digital error correction introduced by digital error corrector circuit 28 removes the effects of the dither, even for signals approaching full scale. In addition, and unlike other dither techniques, the analog input signal does not have to be processed for inclusion of dither before being provided as an input to multistage converter 10, thereby reducing the complexity of the converter or supporting external circuitry.

The invention is particularly useful in communications systems, signal processing applications, signal conversion applications, and audio equipment. Such applications have the advantage of introducing dither into a converter while not utilizing a portion of the signal frequency spectrum to introduce the dither, thereby maintaining the entire available frequency range for signal bandwidth. Spurious tones are reduced in magnitude and spread-out in frequency.

While an illustrative embodiment of the invention has been described in which each stage produced the same number of bits in the digital output, the invention is not limited thereto. The stages of the converter may produce differing numbers of bits as respective digital outputs. Furthermore, while an illustrative embodiment of the invention has been described as providing comparator outputs that are high when the input is greater than the threshold, the invention is not limited thereto. The output can also be high when the comparator input is the same as the threshold. Other methods of generating the thresholds, and other number of comparators to generate thresholds, are within the scope of the invention. Furthermore, the number of comparators is not limited to being three as in the illustrated embodiment. The invention may use more or fewer comparators. In addition, it will be appreciated by those skilled in the art that a converter can be implemented in a switched capacitor architecture or an equivalent resistor architecture.

What is claimed is:

1. A multiple stage converter for converting a sampled analog signal to a corresponding digital representation, comprising:

a plurality of stages, each stage receiving an analog input signal and producing a partial digital output, a first stage receiving the sampled analog signal as the analog input signal, each stage except a last stage providing a residue output which is the analog input signal to a subsequent stage, the residue being the analog input signal to the stage less the partial digital output from the stage, possibly with a gain change, at least one stage comprising:

a lower comparator defining a lower threshold within a voltage range over which the analog input signal may vary, the lower comparator receiving the analog input signal and providing a lower comparator output;

an upper comparator defining an upper comparator threshold within the voltage range over which the analog input signal may vary, the upper comparator receiving the analog input signal and providing an upper comparator output;

a middle comparator defining a midrange comparator threshold within the voltage range over which the analog input signal will vary, the middle comparator receiving the analog input signal and providing a middle comparator output;

a dither generator for providing a dither signal; and a dither circuit for receiving the lower comparator output, the upper comparator output, the middle comparator output, and the dither signal, the dither circuit providing the partial digital output that does not include the dither signal when the analog input is in a range where the addition of dither would create uncorrectable errors.

2. A multiple stage converter as recited in claim 1, further comprising:

an error corrector circuit for receiving the partial digital output from each of the stages and for generating the corresponding digital representation therefrom, the error corrector circuit removing redundancy and effects of the dither signal from the partial digital outputs.

3. A multiple stage converter as recited in claim 1, wherein the lower comparator threshold is set within the voltage range at an edge of a correctable error range.

4. A multiple stage converter as recited in claim 1, wherein the upper comparator threshold is set within the voltage range at an edge of a correctable error range.

5. A multiple stage converter as recited in claim 1, wherein the middle comparator threshold is set at a common point of the two correctable ranges.

6. A multiple stage converter as recited in claim 1, wherein the comparator thresholds divide the voltage range into four equal magnitude regions.

7. A multiple stage converter as recited in claim 1, wherein the voltage range over which an analog input signal may vary extends from a minimum voltage reference to a maximum voltage reference.

8. A multiple stage converter as recited in claim 1, wherein the lower comparator threshold is set one-fourth of the way from the minimum voltage reference to the maximum voltage reference.

9. A multiple stage converter as recited in claim 1, wherein the upper comparator threshold is set three-fourths of the way from the minimum voltage reference to the maximum voltage reference.

10. A multiple stage converter as recited in claim 1, wherein the middle comparator threshold is set midway between the minimum voltage reference and the maximum voltage reference.

11. A multiple stage converter as recited in claim 1, wherein the dither circuit receives the lower comparator output, the upper comparator output, the middle comparator output, and the dither signal, the dither circuit combining the dither signal with the comparator outputs to provide first, second and third dithered outputs, at least two of the three dithered outputs being selected as the partial digital output.

12. A multiple stage converter as recited in claim 1, wherein the dither circuit receives the lower comparator output, the upper comparator output, the middle comparator output, and the dither signal, the dither circuit combining the dither signal with the comparator outputs to provide first, second and third dithered outputs, at least one of the first, second and third dithered outputs being dithered when a magnitude of the analog input signal is within a predetermined range.

13. A multiple stage converter as recited in claim 1, wherein the converter is fully differential.

14. A multiple stage converter as recited in claim 1, wherein the converter is implemented in an integrated circuit.

15. A multiple stage converter as recited in claim 1, wherein the integrated circuit comprises one of a microprocessor, a micro-controller, and a digital signal processor.

16. A multiple stage converter as recited in claim 1, wherein the each stage produces a two bit partial digital output.

17. A multiple stage converter as recited in claim 1, wherein at least one of said first, second, and third comparators provides an output that is a logic low when the analog input signal is less than the threshold of said at least one comparator, and is a logic high otherwise.

18. A multiple stage converter as recited in claim 1, wherein each of said first, second, and third comparators provides an output that is a logic low when the analog input signal is less than the threshold of the respective comparator, and is a logic high otherwise.

19. A method for converting a sampled analog signal to a corresponding digital representation in a converter having a plurality of stages, each stage receiving an analog input signal and producing a partial digital output, a first stage receiving the sampled analog signal as the analog input signal, each stage except a last stage providing a residue output which is the analog input signal to a subsequent stage, the residue being the analog input signal to the stage less the partial digital output from the stage, possibly with a gain change, comprising the steps of:

defining a voltage range over which a sample of an analog signal can vary, the voltage range having a lower limit and an upper limit;

establishing a lower comparator threshold between the lower limit and upper limit of the voltage range;

establishing an upper comparator threshold within the voltage range, the upper comparator threshold being between the lower comparator threshold and the upper limit;

slicing a sampled analog signal based on the lower comparator threshold and the upper comparator threshold to generate a sliced sampled analog signal; and adding dither to the sliced sampled analog signal to produce the partial digital output when the sliced sampled analog signal is greater than the lower comparator threshold and less than the upper comparator threshold.

20. A method for converting a sampled analog signal to a corresponding digital representation, as recited in claim 19, further comprising the step of:

not adding dither to the sliced sampled analog signal to produce the partial digital when the sliced sampled analog signal is less than the lower comparator threshold or greater than the upper comparator threshold.

21. A method for converting a sampled analog signal to a corresponding digital representation, as recited in claim 19, further comprising the step of:

providing the partial digital output to an error corrector circuit for generating the corresponding digital representation therefrom, the error corrector circuit removing redundancy and effects of the dither signal from the partial digital outputs.

* * * * *